United States Patent
Park et al.

(10) Patent No.: US 6,696,313 B2
(45) Date of Patent: Feb. 24, 2004

(54) METHOD FOR ALIGNING QUANTUM DOTS AND SEMICONDUCTOR DEVICE FABRICATED BY USING THE SAME

(75) Inventors: Yong Ju Park, Seoul (KR); Eun Kyu Kim, Seoul (KR); Kwang Moo Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 41 days.

(21) Appl. No.: 09/947,375

(22) Filed: Sep. 7, 2001

(65) Prior Publication Data

US 2002/0031900 A1 Mar. 14, 2002

(30) Foreign Application Priority Data

Sep. 9, 2000 (KR) .......................................... 2000-53649

(51) Int. Cl.[7] .............................................. H01L 21/00
(52) U.S. Cl. ....................... 438/47; 438/758; 438/938; 438/962; 257/15; 257/18
(58) Field of Search .............................. 257/14, 15, 18, 257/19; 438/47, 507, 758, 938, 962

(56) References Cited

U.S. PATENT DOCUMENTS 6,507,042 B1 * 1/2003 Mukai et al. .................. 257/14
6,541,788 B2 * 4/2003 Petroff et al. .................. 257/21

FOREIGN PATENT DOCUMENTS

JP          10-215032          8/1998

OTHER PUBLICATIONS

Holy, V. et al. "Strain Induced Vertical and Lateral Correlations in Quantum Dot Superlattices," Phys. Rev. Lett. vol. 83(2), pp. 356–359, Jul. 12, 1999.*

* cited by examiner

Primary Examiner—Sara Crane
(74) Attorney, Agent, or Firm—Oblon, Spivak, McClelland, Maier & Neustadt, P.C.

(57) ABSTRACT

A method for aligning quantum dots effectively controls a growth position of the quantum dots for obviating an irregularity of a position of spontaneous formation quantum dots, and thus aligns the quantum dots in one-dimension (1-D) or two-dimension (2-D). A semiconductor device fabricated using the method manufactures a superlattice layer layer for adjusting an internal strain distribution by alternately depositing two semiconductor materials having different lattice constant, and grows spontaneous formation quantum dots on the superlattice layer. As a result, a strained force caused by the superlattice layer influences on the quantum dots so that the quantum dots can be regularly aligned.

7 Claims, 3 Drawing Sheets

METHOD FOR ALIGNING QUANTUM DOTS AND SEMICONDUCTOR DEVICE FABRICATED BY USING THE SAME

FIELD OF THE INVENTION

The present invention relates to a method for manufacturing a semiconductor device having quantum dots. More particularly, it relates to a method for aligning quantum dots so as to effectively control a growth position of quantum dots.

BACKGROUND OF THE INVENTION

Recently, quantum dots are a quantum structure having a freedom degree of a zero-dimension (0-D), and have various good characteristics. That is, when the quantum dots are applied to either an opto-electronic device such as a light emitting diode (LED), a laser diode (LD), and a photodetector, or an electronic device such as a single electronic transistor, a threshold current becomes lower, an optical gain becomes higher, and a temperature sensitivity becomes dull. Therefore, the elements applicable to the quantum dots have been used popularly as the next generation elements in these days.

As a technique for fabricating a semiconductor substrate having quantum dots using a natural phenomenon without an additional lithography, among a plurality of methods for forming quantum dots, Stanski-Krastanow (S-K) growth technique using a stress relaxation of a lattice mismatch layer has been widely developed. However, although quantum dots using such a lattice mismatch do not require a prior/post patterning process because of a spontaneous formation, it is difficult to control a size or position of the quantum dots because irregular quantum dots are randomly distributed on a substrate.

Except for the S-K growth technique, as a currently well-known technique for aligning quantum dots, a method for growing quantum dots on a patterned substrate having a ridge and tetrahedral pits, a method for growing quantum dots on a buffer layer having a multiatomic step formed on a vicinal substrate, and a method for growing quantum dots on GaAS <100> mesa surface formed on a patterned oxide layer were developed, where <100> means an alignment direction.

However, these methods may occur a damage caused by a dry etching in patterning the substrate, and a position and a width of a three-dimensional structure according to misorientation angle may be limited. And, the third method for growing quantum dots on GaAs <100> mesa surface formed on the patterned oxide layer has some difficulty in adjusting a position of quantum dots, and requires a compliex prior/post patterning process.

SUMMARY OF THE INVENTION

It is, therefore, an objective of the present invention to provide a method for effectively controlling a growth alignment of quantum dots without requiring a complex prior/post patterning process, and a semiconductor device fabricated by using the method.

In accordance with one aspect of the present invention, in order to achieve this objective, a method for fabricating a semiconductor device having quantum dots comprises the steps of: preparing a substrate; growing a superlattice strained layer by alternately depositing at least two semiconductor materials having different lattice constant by a predetermined cycle; and forming a quantum-dot active layer including quantum dots on the superlattice strained layer, where the quantum dots are aligned on the superlattice strained layer along an internal strain of the superlattice stained layer, wherein the internal strain is induced by the alternate deposition during the predetermined cycle, and the predetermined cycle is determined in consideration of the internal strain.

The two semiconductor materials are selected from a compound including at least one among In, Ga and Al. The compound of the two materials is based on $In_xGa_{1-x}As/GaAs$, $In_xGa_{1-x}As/Al_yGa_{1-y}As$, $In_xGa_{1-x}P/InP$, $Al_yGa_{1-y}P/InP$, or $In_xGa_{1-x}As/InP$, where each of x and y has a value of 0 to 1. The quantum-dot active layer is based on $In_xGa_{1-x}As$, where x has a value of 0 to 1. The predetermined cycle is determined to make a thickness of the superlattice strained layer be thicker than a critical thickness inducing a lattice relaxation of the superlattice strained layer because of the internal strain. The predetermined cycle is determined to make the quantum dots on the quantum-dot active layer be aligned in one-dimension (1-D) or two-dimension (2-D). In the step for forming the quantum-dot active layer, the quantum dots are grown by alternately depositing a first material and a second material that have a different lattice constant from each other by at least one time, in order to make a distribution of the quantum dots be one-dimensional (1-D) alignment or two-dimensional (2-D) alignment. Prior to the step for forming the quantum-dot active layer, a buffering layer is deposited on the superlattice strained layer, for protecting a device to be mounted on the semiconductor device in post process.

In accordance with another aspect of the present invention, a semiconductor device having quantum dots comprises: a substrate; a superlattice strained layer formed on the substrate, in which at least two semiconductor materials having different lattice constant are alternately deposited by a predetermined cycle; and a quantum-dot active layer formed on the superlattice strained layer, including quantum dots aligned along an internal strain of the superlattice stained layer, wherein the internal strain is induced by the alternate deposition during the predetermined cycle, and the predetermined cycle is determined in consideration of the internal strain.

BRIEF DESCRIPTIONS OF THE DRAWINGS

The above and other objects and features of the present invention will become apparent from the following description of preferred embodiments given in conjunction with the accompanying drawings, in which.

Figure 5:
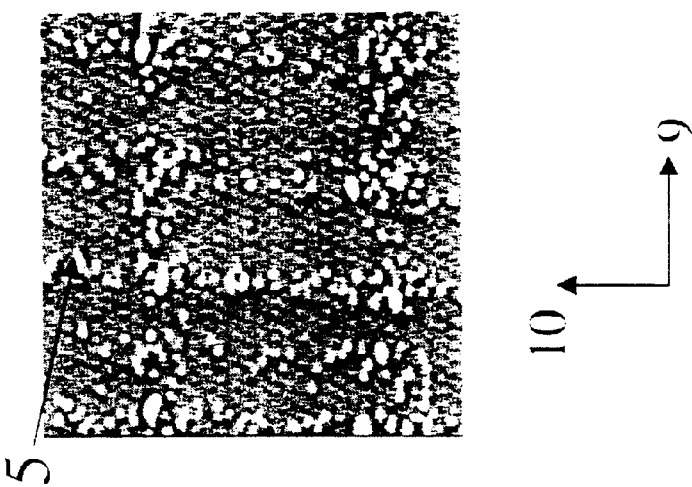
Figure 4:
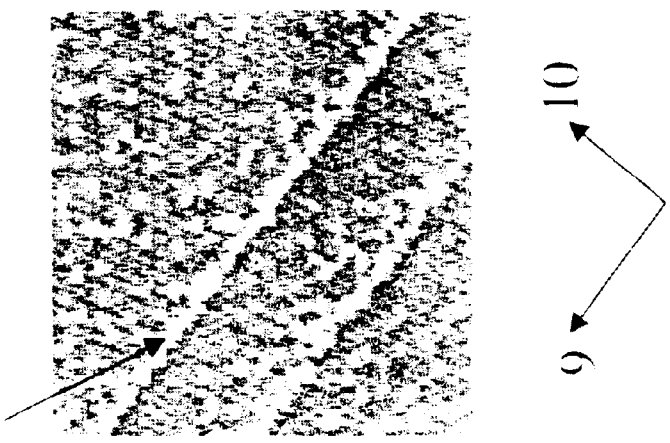

FIG. 4 is an image showing a random distribution of spontaneous formation quantum dots 5 grown in case that a cycle of a superlattice layer 4 is set to 15; and FIG. 5 is an image showing a random distribution of spontaneous formation quantum dots 5 grown in case that a cycle of a superlattice layer 4 is set to 20.

DETAILED DESCRIPTION OF THE PRESENT INVENTION

An embodiment of the present invention will now be described in details in reference to the accompanying drawings.

Figure 1:
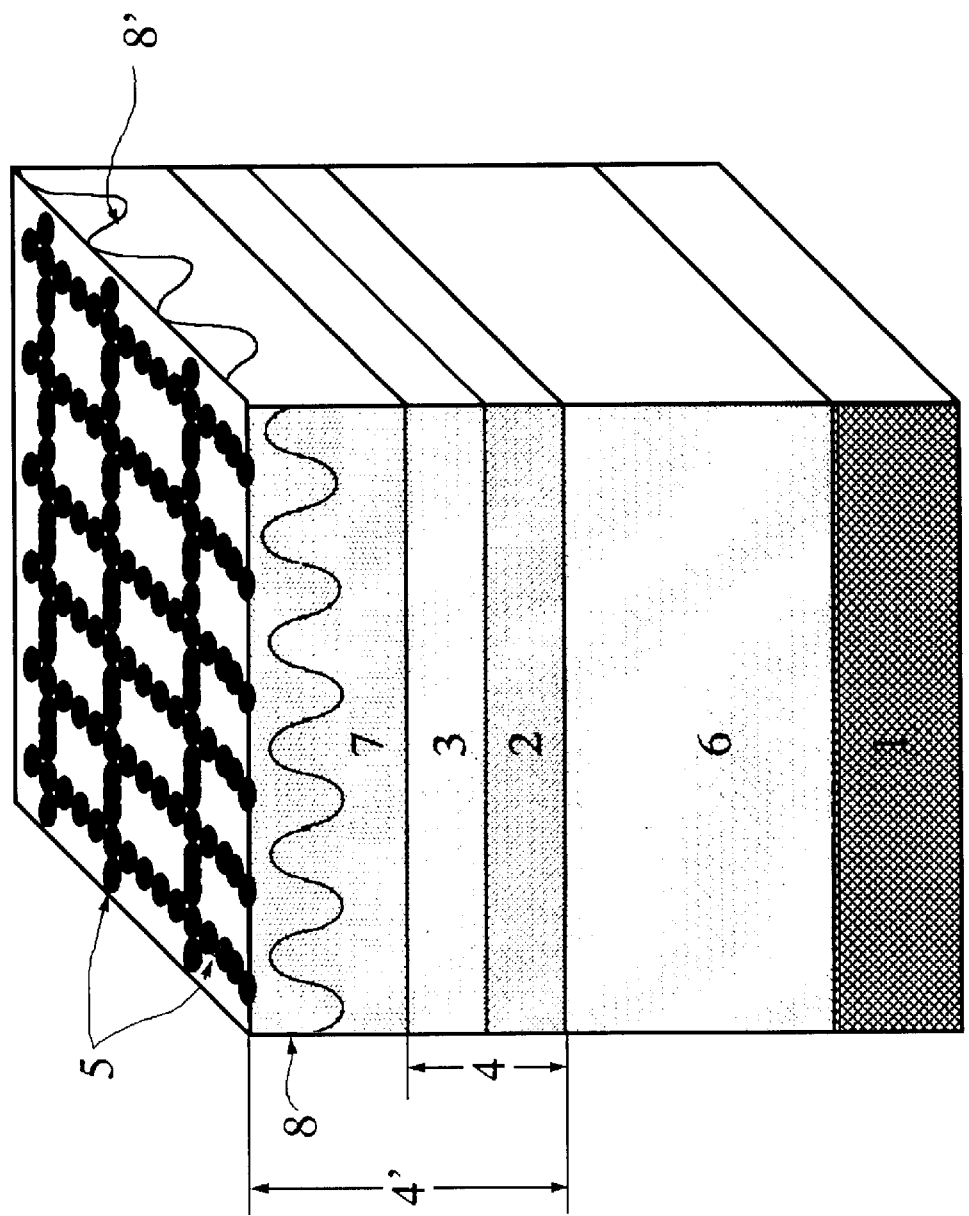
FIG. 1 is a cross-sectional view of a semiconductor device having quantum dots fabricated by using a method for aligning quantum dots in accordance with a preferred embodiment of the present invention.

FIG. 1 is a cross-sectional view of a semiconductor device having quantum dots fabricated by using a method for aligning quantum dots in accordance with a preferred embodiment of the present invention. As shown in FIG. 1, a semiconductor device having quantum dots according to the present invention includes a substrate 1, first and second buffering layers 6 and 7, and a superlattice layer 4. Quantum dots 5 are formed on the semiconductor device. A method for manufacturing the semiconductor device having such quantum dots will be described in detail in the following description.

GaAs substrate 1 grows a crystal of a semiconductor thin film in the direction of <100>, GaAs is deposited on the GaAs substrate 1 according to a molecular beam epitaxy method, thereby growing a first buffering layer 6 by 0.5 $\mu$m. The first buffering layer 6 prevents unnecessary impurity from being inserted into the GaAs substrate 1, and removes a bad influence generated when the GaAs substrate 1 has uneven surface.

Two kinds of materials having a different lattice constant, e.g., InAs layer 2 of 1 monlayer(ML) and GaAs layer 3 of 4 monolayer(ML), are alternately deposited on the first buffering layer 6 by a predetermined cycle, where 1 cycle is made by once deposition of InAs and once deposition of GaAs. In a preferred embodiment of the present invention, the predetermined cycle can be variously changed. Because of such a changeable cycle, an internal strain energy distribution can be also changed. Specifically, InAs layer 2 of 1 ML and GaAs layer 3 of 4 ML are not grown in three-dimension (3-D), but grown in two-dimension (2-D). However, since the InAs layer 2 and the GaAs layer 3 have a different lattice constant, an internal strain of the superlattice layer 4 becomes gradually increased as a deposition cycle of the InAs layer 2 and the GaAs layer 3 increases. Such strain energy distributions 8 and 8' caused by the an internal strain influence on an alignment of the spontaneous formation quantum dots 5. In other words, if a deposition cycle of the superlattice layer 4 formed by alternately growing two semiconductor materials having different lattice constant, the internal strain energy distributions 8 and 8' can be finely adjusted so that a distribution of the quantum dots 5 formed on the semiconductor device can be repetitionally controlled. Such two kinds of semiconductor materials making the superlattice layer 4 should have a different lattice constant from each other.

For instance, binary compounds made of two kinds of materials, e.g., InAs, AlAs, AlP, GaP and the like, ternary compounds made of three kinds of materials, e.g., InGaAs, AlGaAs, InAlAs, InGaP, AlGaP, InAlP and the like, or quaternary compounds made of four kinds of materials, e.g., InGaAlAs, InAaAlP and the like, each compound combining In, Ga, Al and the like therein, can be properly combined each other in consideration of an application field of semiconductor device. In other words, in order to induce an internal strain of the superlattice layer 4 to a desired degree, they can be selected in consideration of a structure of the superlattice layer 4, i.e., with variable growth parameters such as a composition, thickness, cycle and the like. Specifically, for instance, various materials, based on $In_xGa_{1-x}As/GaAs$, $In_xGa_{1-x}As/Al_yGa_{1-y}As$, $In_xGa_{1-x}P/InP$, $Al_yGa_{1-y}P/InP$, $In_xGa_{1-x}As/InP$, can be employed as a composition of the superlattice layer 4. In this case, x indicates a composition of In, y indicates a composition of Al, each of x and y has a value of 0 to 1.

A second buffering layer 7 made of GaAs of about 20 ML is grown on the superlattice layer 4. The second buffering layer 7 protects a device to be mounted on the semiconductor device in a post-process. As a material of the second buffering layer 7, various materials can be employed according to the kind of semiconductor devices. But, a specific material of sufficiently reflecting internal strain energy distributions 8 and 8' of the superlattice layer 4 should be employed.

Thereafter, if InAs of about 2 ML is deposited on the second buffering layer 7, most InAs materials migrate along the strain energy distribution 8 and 8', are collected along a specific direction and thus quantum dots 5 are formed. Since a lattice mismatch of about 7% occurs between InAs and GaAs, quantum dots made of InAs can be formed on the GaAs layer. In general, a critical thickness for forming the quantum dots made of InAs is about 1.7 ML. A strain energy distribution caused by a lattice mismatch between InAs and GaAs is controlled by adjusting a cycle adjustment of InAs and GaAs layers within the superlattice layer 4, thereby controlling an alignment position of InAs quantum dots.

Therefore, according to the present invention, a technique for controlling a position of spontaneous formation quantum dots 5 can be achieved by once epitaxy process. This technique is the most important matter in an application field of the quantum dots 5. Here, the epitaxy process is made by successive epitaxy growing steps, does not include a complex process such as a mask, a patterning, an etching and a post-growing, and is comprised of an epitaxial growth.

Meanwhile, quantum dots 5 may be comprised of many layers, in this case, if GaAs of about 5–50 ML and InAs of about 2 ML are alternately grown, a deposition structure of quantum dots 5 having an aligned structure can be formed. As a material for forming such quantum dots 5, a material having a different lattice constant from the second buffering layer 7 is needed. For example, in case of using GaAs as the second buffering layer 7, a material based on $In_xGa_{1-x}As$ can be employed as a material for forming quantum dots 5. In this case, x indicates a composition of In, y indicates a composition of Al, each of x and y has a value of 0 to 1.

Figure 2:
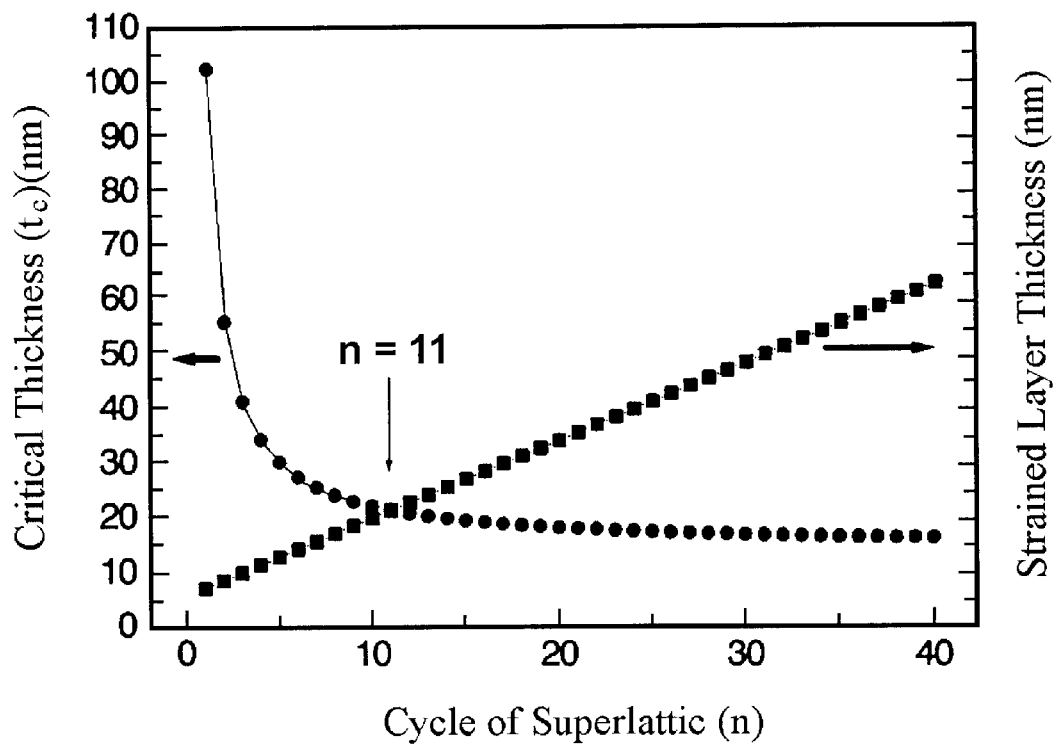
FIG. 2 is a graph showing a critical thickness and a strained layer 4' according to a cycle of a superlattice layer 4 of FIG. 1.

FIG. 2 is a graph showing a critical thickness inducing a lattice relaxation and a strained layer 4' according to a cycle of a superlattice layer 4 of FIG. 1. In this case, the thickness of the strained layer 4' indicates a thickness including the superlattice layer 4's thickness and the second buffering layer 7's thickness under the condition that the second buffering layer 7 is formed as described above. But, if the second buffering layer 7 is omitted, the thickness of the strained layer 4' indicates the thickness of the superlattice layer 4 only.

As seen from FIG. 2, if a cycle of the superlattice layer 4 is over 11, a degree of strain inside the superlattice layer 4 becomes excessive, thereby slowly generating a lattice relaxation of inducing a lattice misfit dislocation. Such a misfit dislocation can be anticipated by a calculation. Experimentally, the misfit dislocation can be checked by a transmission electronic microscope, X-ray diffraction experiment, a surface observation experiment using AFM (Atomic Force Microscopy). In the preferred embodiment of the present invention, a predetermined time at which a ridge shape begins to appear on a sample surface is considered as a time point passing on a critical thickness.

The time point passing on the critical thickness is called a cycle of the superlattice layer 4, and can be varied by a thin film thickness and a thin film composition of two materials needed to form the superlattice layer 4. Also, a thickness of the strained layer 4' is d(nm)=1.435 n+5.65, and can be expressed as a cycle (n) of the superlattice layer 4. In other words, if the cycle (n) of the superlattice layer 4 is adjusted, internal strain distributions 8 and 8' of the superlattice layer 4 are finely adjusted, so that it can be seen that spontaneous formation quantum dots 5 are regularly aligned.

Figure 3:
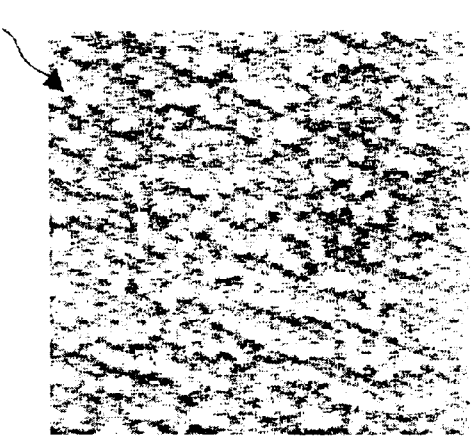
FIG. 3 is an image captured by an atomic force microscopy (AFM), showing a random distribution of spontaneous formation quantum dots 5 grown in case that a cycle of a superlattice layer 4 is set to 10.

FIG. 3 is an image captured by an atomic force microscopy (AFM), showing a random distribution of spontaneous formation quantum dots 5 grown in case that the cycle of the superlattice layer 4 is set to 10 being a thickness below a critical thickness. In case that the cycle of the superlattice layer 4 is set to any number below 11, a lattice relaxation does not occur so that there is no influence on a position control of spontaneous formation quantum dots 5. Therefore, it can be seen that there is no regularity in a distribution of spontaneous formation quantum dots 5.

FIG. 4 is an image showing a random distribution of spontaneous formation quantum dots 5 grown in case that a cycle of a superlattice layer 4 is set to 15. In contrast to FIG. 3, since the 4's cycle 15 can sufficiently induce a lattice relaxation, a distribution form of quantum dots 5 is aligned in the direction 9 of <110> being a direction of a lattice relaxation. The reason why the quantum dots 5 is aligned in the direction 9 of <110> is that the direction 9 of <110> of the GaAs substrate 1 undergoes the largest variation by the internal strain force. Thus, the internal strain distributions 8 and 8' of the superlattice layer 4 of InAs2/GaAs3 are periodically distributed along the direction 9 of <110>. InAs grown for forming quantum dots 5 under such the internal strain distributions 8 and 8' mostly migrates along the distributions 8 and 8' simultaneously with being collected along a specific direction, thereby forming a regular alignment.

FIG. 5 is an image showing a random distribution of spontaneous formation quantum dots 5 grown in case that a cycle of the superlattice layer 4 is set to 20. In comparison with FIG. 4, a distribution of spontaneous formation quantum dots 5 grown on the superlattice layer 4 including excessive strain which is more prominent than FIG. 4, is aligned in the direction 9 of <110> as well as in the direction 10 of <1$\bar{1}$0>. Since the direction 9 of <110> makes a right angle with the direction 10 of <1$\bar{1}$0>, if a cycle of the superlattice layer 5 is set to 20, a two-dimensional alignment of the quantum dots 5 is made as shown in FIG. 5.

As described above, the internal strain distributions 8 and 8' are adjusted by a cycle that is determined according to a composition ratio and a thickness of two materials comprising the superlattice layer 4, an alignment position of the quantum dots 5 grown on the superlattice layer 4 can be regularly distributed, thereby controlling a position of the spontaneous formation quantum dots 5 without requiring a complex process.

Therefore, the present invention does not require a prior/post process such as a complex patterning process, can make a regular alignment of quantum dots through once epitaxy growth step without using a specific substrate, and can control a position of quantum dots 5. As a result, quantum dots 5 can be easily applicable to an optical element or electronic element.

Although GaAs is used as a component of the substrate 1, the first buffering layer 6, the second buffering layer 8, and quantum dots 5 in the preferred embodiment of the present invention, another material except the GaAs, e.g., InP, can be used.

While the present invention has been described and illustrated with respect to a preferred embodiment of the invention, it will be apparent to those skilled in the art that variations and modifications are possible without deviating from the broad principles and teachings of the present invention which should be limited solely by the scope of the claims appended hereto.

What is claimed is:

1. A method for fabricating a semiconductor device having quantum dots, comprising the steps of:

preparing a substrate;

growing a superlattice strained layer by alternately depositing at least two semiconductor materials having different lattice constant by a predetermined cycle;

forming a quantum-dot active layer including quantum dots on the superlattice strained layer, where the quantum dots are aligned on the superlattice strained layer along an internal strain of the superlattice strained layer;

wherein the internal strain is induced by the alternate deposition during the predetermined cycle, and the predetermined cycle is determined in consideration of the internal strain, wherein the predetermined cycle is determined to make a thickness of the superlattice strained layer be wider than a critical thickness inducing a lattice relaxation of the superlattice strained layer because of the internal strain.

2. The method of claim 1, wherein the two semiconductor materials are selected from a compound including at least one among In, Ga and Al.

3. The method of claim 2, wherein the compound of the two materials is based on $In_xGa_{1-x}As/GaAs$, $In_xGa_{1-x}As/Al_yGa_{1-y}As_{1-y}$, $In_xGa_{1-x}P/InP$, $Al_yGa_{1-y}P/InP$, or $In_xGa_{1-x}As/InP$, where each of x and y has a value of 0 to 1.

4. The method of claim 1, wherein the quantum-dot active layer is based on $In_xGa_{1-x}As$ and $In_xGa_{1-x}P$, where x has a value of 0 to 1.

5. The method of claim 1, wherein the predetermined cycle is determined to make the quantum dots on the quantum-dot active layer be aligned in one-dimension (1-D) or two-dimension (2-D).

6. The method of claim 1, wherein the step for forming the quantum-dot active layer grows the quantum dots by alternately depositing a first material and a second material that have a different lattice constant from each other by at least one time, in order to make a distribution of the quantum dots be one-dimensional (1-D) alignment or two-dimensional (2-D) alignment.

7. The method of claim 1, further comprising:

prior to the step for forming the quantum-dot active layer, depositing a buffering layer on the superlattice strained layer, for protecting a device to be mounted on the semiconductor device in post process.

* * * * *